(12) United States Patent
Burrows et al.

(10) Patent No.: US 12,334,341 B2
(45) Date of Patent: Jun. 17, 2025

(54) CHAMBER BODY FEEDTHROUGH FOR IN CHAMBER RESISTIVE HEATING ELEMENT

(71) Applicant: Applied Materials, Inc., Santa Clara, CA (US)

(72) Inventors: Brian Hayes Burrows, San Jose, CA (US); Ala Moradian, Sunnyvale, CA (US); Zuoming Zhu, Sunnyvale, CA (US); Chia Cheng Chin, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 821 days.

(21) Appl. No.: 17/579,762

(22) Filed: Jan. 20, 2022

(65) Prior Publication Data
US 2022/0254634 A1 Aug. 11, 2022

Related U.S. Application Data (60) Provisional application No. 63/148,273, filed on Feb. 11, 2021.

(51) Int. Cl.
*H01L 21/02* (2006.01)
*C23C 16/458* (2006.01)
*H01L 21/67* (2006.01)

(52) U.S. Cl.
CPC .... *H01L 21/02658* (2013.01); *C23C 16/4586* (2013.01); *H01L 21/67103* (2013.01)

(58) Field of Classification Search
CPC . C23C 16/0209; C23C 16/4586; C23C 16/54; F27B 17/0025; H01L 21/02658; H01L 21/67103; H01L 21/67109; H01L 21/67115; H01L 21/67126; H01L 21/67184; H01L 21/6719; H01L 21/67248; H01L 21/68771
USPC .................................................... 219/443.1
See application file for complete search history.

(56) References Cited

U.S. PATENT DOCUMENTS

| | | | |
|---|---|---|---|
| 6,352,593 B1 | 3/2002 | Brors et al. | |
| 7,645,342 B2 * | 1/2010 | Emerson | C30B 25/105 156/345.52 |
| 2001/0054387 A1 | 12/2001 | Frankel et al. | |
| 2002/0005400 A1 | 1/2002 | Gat | |
| 2003/0049372 A1 | 3/2003 | Cook et al. | |

(Continued)

FOREIGN PATENT DOCUMENTS

WO 2022031422 A1 2/2022

OTHER PUBLICATIONS

International Search Report and Written Opinion dated May 11, 2022 for Application No. PCT/US2022/013040.

(Continued)

*Primary Examiner* — Sang Y Paik
(74) *Attorney, Agent, or Firm* — Patterson + Sheridan, LLP (57) ABSTRACT

A method and apparatus for providing uniform heating of substrates disposed within a processing chamber is provided. The apparatus includes one or more heating coils disposed in the processing chamber. The one or more heating coils are electrically coupled to a power source using heater rods. The heater rods are coupled to a socket on a distal end opposite the connection to the heating coils. The socket includes a feedthrough and a cooling plate configured to remove contaminants, such as methane, from the area surrounding the heater rod.

20 Claims, 8 Drawing Sheets

(56) References Cited

U.S. PATENT DOCUMENTS

| | | |
|---|---|---|
| 2005/0133159 A1 | 6/2005 | Johnsgard et al. |
| 2007/0084406 A1 | 4/2007 | Yudovsky et al. |
| 2007/0131674 A1* | 6/2007 | Kushihashi ............ H01C 17/00 |
| | | 219/543 |
| 2009/0178764 A1* | 7/2009 | Kanno .............. H01L 21/67103 |
| | | 156/345.52 |
| 2010/0162956 A1 | 7/2010 | Murakami et al. |
| 2010/0317197 A1 | 12/2010 | Lind et al. |
| 2011/0248024 A1 | 10/2011 | Yonenaga et al. |
| 2016/0126125 A1* | 5/2016 | Okugawa .......... H01L 21/67103 |
| | | 219/444.1 |
| 2017/0103907 A1 | 4/2017 | Chu et al. |
| 2021/0375599 A1* | 12/2021 | Noujaim ........... H01L 21/67103 |

OTHER PUBLICATIONS

Office Action for Korean Application No. 10-2023-7013368 dated Sep. 26, 2024.

* cited by examiner

CHAMBER BODY FEEDTHROUGH FOR IN CHAMBER RESISTIVE HEATING ELEMENT

CROSS-REFERENCE TO RELATED APPLICATIONS

This application claims priority to U.S. Provisional Patent Application No. 63/148,273, filed Feb. 11, 2021, the entirety of which is herein incorporated by reference.

BACKGROUND

Field

Examples described herein generally relate to the field of semiconductor substrate processing, and more specifically, to pre-epitaxial baking of semiconductor substrates. Pre-epitaxial baking is performed before an epitaxial deposition operation to clean the substrate.

Description of the Related Art

In conventional semiconductor fabrication, substrates, such a wafers, are pre-cleaned to remove contaminants, such as oxides, prior to thin film growth thereon by epitaxial processes. Pre-cleaning of substrates is performed by baking the wafers in a hydrogen atmosphere either in a single substrate epitaxial (Epi) chamber or in a furnace. Single substrate Epi chambers are designed to provide uniform temperature distribution over a substrate disposed within a processing volume and precise control of gas flow over the substrate. However, a single substrate Epi chamber processes one substrate at a time, and thus may not provide required throughputs in fabrication processes. Furnaces enable batch processing of multiple substrates. However, furnaces do not provide uniform temperature distribution over each substrate and/or between substrates disposed in a processing volume, and thus may not provide required qualities in fabricated devices. In particular, heat loss in the vicinity of substrate edges causes highly non-uniform temperature distribution over each substrate.

Therefore, there is need for a process and processing equipment that is able to perform batch multi-substrate process while reducing heat loss in the vicinity of substrate edges to provide uniform temperature distribution over a substrate.

SUMMARY

The present disclosure generally relates to a system for processing a semiconductor substrate. More specifically, the present disclosure relates to an embodiment of a heating system for substrate processing. The heating system includes a first heater comprising a continuous heating coil, a first heater rod coupled to a first connection point of the first heater, a second heater rod coupled to a second connection point of the first heater, a socket coupled to one of the first heater rod or the second heater rod at a distal end opposite the first heater. Each of the first heater rod and the second heater rod are configured to be screwed onto the first heater and comprise a passage disposed therethrough. The socket includes a feedthrough coupled to the first heater rod or the second heater rod and comprising a feedthrough inert gas passage fluidly coupled to the passage disposed through the first heater rod or the second heater rod. A cooling plate is disposed around at least a portion of the feedthrough.

In another embodiment, a socket assembly for coupling to a heater rod in a substrate processing chamber is described. The socket assembly includes a feedthrough and a cooling plate disposed around at least a portion of the feedthrough. The feedthrough includes a cavity containing a female threaded section and configured to receive a heater rod and a feedthrough inert gas passage fluidly coupled to the cavity. The cooling plate includes a cooling plate inert gas passage, a connection channel disposed in a surface of the cooling plate and fluidly connecting the cooling plate inert gas passage and the feedthrough inert gas passage, and a cooling channel disposed through the cooling plate.

In yet another embodiment, a heating system for substrate processing is described. The heating system includes a first heater with a continuous heating coil, a first heater rod coupled to a first connection point of the first heater, a second heater rod coupled to a second connection point of the first heater, and a socket coupled to one of the first heater rod or the second heater rod. Each of the first heater rod and the second heater rod comprise a passage disposed therethrough. The socket includes a feedthrough coupled to the first heater rod or the second heater rod and comprising a feedthrough inert gas passage fluidly coupled to the passage disposed through the first heater rod or the second heater rod. A cooling plate is disposed around at least a portion of the feedthrough and includes a cooling plate inert gas passage fluidly coupled to the feedthrough inert gas passage and a cooling channel disposed through the cooling plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to semiconductor processing. More specifically, the present disclosure relates to pre-epitaxial baking of substrates within a semiconductor processing chamber.

Embodiments described herein provide a multi-substrate batch processing system where multiple substrates are simultaneously pre-cleaned to remove contaminants, such as oxides. The pre-cleaning of the multiple substrates includes baking the substrates in a hydrogen atmosphere in either a single or a batch epitaxial deposition chamber. The epitaxial deposition chamber maintains a uniform temperature distribution over each of the substrates disposed within a processing volume. Thus, the multi-substrate batch processing system may provide improved qualities and throughputs in fabricated devices.

The apparatus for maintaining the uniform temperature distribution includes one or more heaters disposed within the processing chamber. The one or more heaters are resistive heating coils which are disposed around at least a portion of the processing chamber volume. The one or more resistive heating coils are coated to reduce the interaction of the coil material with the environment inside of the processing chamber. The resistive heating coils are coupled to a power source via a heater rod. The heater rod is separate from the resistive heater coils, but may be similarly coated with the coating material. The material of the resistive heater coils and the heater rod is porous. The combination of the coating and a purge gas system assist in reducing contamination of the substrates within the processing chamber from breakdown of the resistive heater coil and heater rod materials.

Various embodiments are described herein. Although multiple elements of different embodiments may be described together in a process flow or system, the multiple elements can each be implemented individually, in the combinations described herein, in a variant of the systems described herein, or in a different process flow or system.

Figure 1:
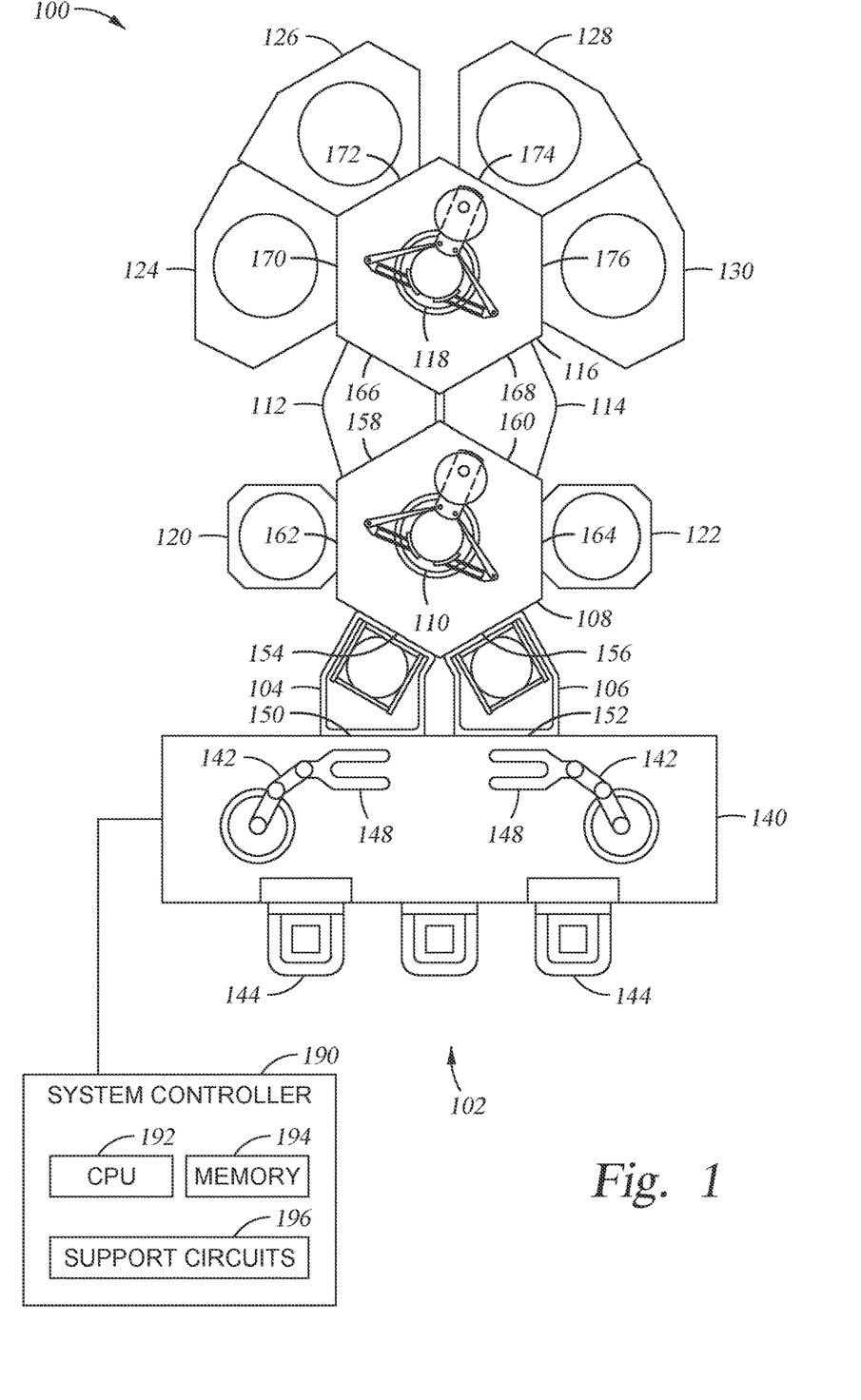
FIG. 1 is a schematic plan view of an example of a semiconductor processing system, according to one or more embodiments.

FIG. 1 is a schematic plan view diagram of an example of a semiconductor processing system 100 according to one or more embodiments. The processing system 100 generally includes a factory interface 102, load lock chambers 104, 106, transfer chambers 108, 116 with respective transfer robots 110, 118, holding chambers 112, 114, and processing chambers 120, 122, 124, 126, 128, 130. As detailed herein, substrates in the processing system 100 can be processed in and transferred between the various chambers without being exposed to an ambient environment exterior to the processing system 100. For example, substrates can be processed in and transferred between the various chambers in a low pressure (e.g., less than or equal to about 300 Torr) or vacuum environment without breaking the low pressure or vacuum environment between various processes performed on the substrates in the processing system 100. Accordingly, the processing system 100 may provide for an integrated solution for some processing of substrates.

Examples of a processing system that may be suitably modified in accordance with the disclosure provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 disposed within the docking station 140 to facilitate transfer of substrates. The docking station 140 is coupled to one or more front opening unified pods (FOUPs) 144. In some examples, each factory interface robot 142 generally comprises a blade 148 disposed on one end of the respective factory interface robot 142 configured to transfer substrates from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 112, 114 and respective ports 162, 164 coupled to processing chambers 120, 122. Similarly, the transfer chamber 116 has respective ports 166, 168 coupled to the holding chambers 112, 114 and respective ports 170, 172, 174, 176 coupled to processing chambers 124, 126, 128, 130. The ports 154, 156, 158, 160, 162, 164, 166, 168, 170, 172, 174, 176 can be, for example, slit openings with slit valves for passing substrates therethrough by the transfer robots 110, 118 and for providing a seal between respective chambers to prevent a gas from passing between the respective chambers. Generally, any port is open for transferring a substrate therethrough; otherwise, the port is closed.

The load lock chambers 104, 106, transfer chambers 108, 116, holding chambers 112, 114, and processing chambers 120, 122, 124, 126, 128, 130 may be fluidly coupled to a gas and pressure control system. The gas and pressure control system can include one or more gas pumps (e.g., turbo pumps, cryo-pumps, roughing pumps, etc.), gas sources, various valves, and conduits fluidly coupled to the various chambers. In operation, a factory interface robot 142 transfers a substrate from a FOUP 144 through a port 150 or 152 to a load lock chamber 104 or 106. The gas and pressure control system then pumps down the load lock chamber 104 or 106. The gas and pressure control system further maintains the transfer chambers 108, 116 and holding chambers 112, 114 with an interior low pressure or vacuum environment (which may include an inert gas). Hence, the pumping down of the load lock chamber 104 or 106 facilitates passing the substrate between e.g., the atmospheric environment of the factory interface 102 and the low pressure or vacuum environment of the transfer chamber 108.

The processing chambers 120, 122, 124, 126, 128, 130 can be any appropriate chamber for processing a substrate. In some examples, the processing chamber 122 can be capable of performing a cleaning process; the processing chamber 120 can be capable of performing an etch process; and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif. Other chambers, including those from other manufacturers, are also contemplated.

A system controller 190 is coupled to the processing system 100 for controlling the processing system 100 or components thereof. For example, the system controller 190 may control the operation of the processing system 100 using a direct control of the chambers 104, 106, 108, 112, 114, 116, 120, 122, 124, 126, 128, 130 of the processing system 100 or by controlling controllers associated with the chambers 104, 106, 108, 112, 114, 116, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting.

The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 116 and the holding chambers 112, 114. In other examples, more or fewer transfer chambers (e.g., one transfer chamber) and/or more or fewer holding chambers (e.g., no holding chambers) may be implemented as a transfer apparatus in a processing system.

Figure 2:
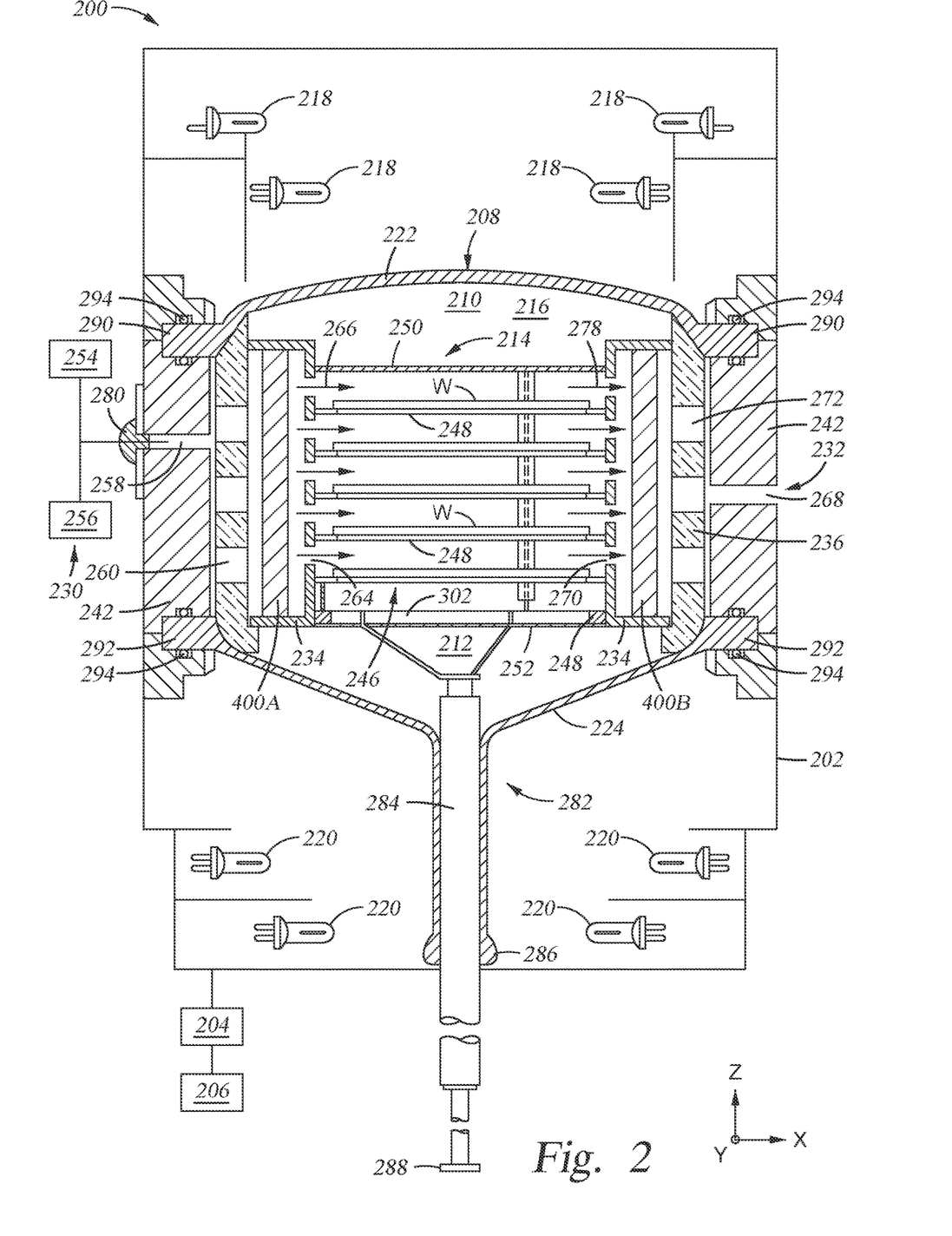
FIG. 2 is a schematic cross-sectional view of an exemplary processing chamber that may be used to perform batch multi-substrate cleaning processes, according to one or more embodiments.

FIG. 2 is a schematic cross-sectional view of an exemplary processing chamber 200 that may be used to perform batch multi-substrate processes, such as a baking process in hydrogen atmosphere at a temperature of about 800° C. A separate processing chamber is utilized to perform an epitaxial deposition operation. The separate processing chamber may also be disposed as part of the processing system 100 and may be a single substrate or batch substrate system. In some embodiments, the apparatus disclosed herein may also be used for epitaxial deposition processes. The processing chamber 200 described herein may additionally be utilized for $H_2$ baking of substrates to remove carbon/oxygen residues, HCl baking of substrates to etch undoped/doped silicon, epitaxial deposition of one or more layers (including Si, SiGe, SiGeB, SiB, SiP, etc.), and deposition of poly and amorphous silicon (doped or undoped). The processing chamber 200 may be used in place of any one of processing chambers 120, 122, 124, 126, 128, 130 from FIG. 1. Non-limiting examples of the suitable processing chambers that may be modified according to embodiments disclosed herein may include the RP EPI reactor, which is commercially available from Applied Materials, Inc. of Santa Clara, Calif. The processing chambers 200 may be added to a CENTURA® integrated processing system available from Applied Materials, Inc., of Santa Clara, Calif. While the processing chamber 200 is described below to be utilized to practice various embodiments described herein, other semiconductor processing chambers from different manufacturers may also be used to practice the embodiment described in this disclosure.

The processing chamber 200 includes a housing structure 202, a support system 204, and a controller 206. The housing structure 202 is made of a process resistant material, such as aluminum or stainless steel. The housing structure 202 encloses various elements of the processing chamber 200, such as a quartz chamber 208, which includes an upper portion 210 and a lower portion 212. A process kit 214 is adapted to receive multiple substrates W within the quartz chamber 208, in which a processing volume 216 is contained.

As used herein, the term "substrate" refers to a layer of material that serves as a basis for subsequent processing operations and includes a surface to be disposed for forming thin films thereon. The substrate may be a silicon substrate, silicon oxide, strained silicon, silicon germanium, doped or undoped polysilicon, doped or undoped silicon substrates, patterned or non-patterned substrates silicon on insulator (SOI), carbon doped silicon oxides, silicon nitride, indium phosphide, germanium, gallium arsenide, gallium nitride, quartz, fused silica, glass, or sapphire. Moreover, the substrate is not limited to any particular size or shape. The substrate can be a round substrate having a 200 mm diameter, a 300 mm diameter or other diameters, such as 450 mm, among others. The substrate W can also be any polygonal, square, rectangular, curved or otherwise non-circular workpiece, such as a polygonal glass substrate.

Heating of the substrates W may be provided by radiation sources, such as one or more upper lamp modules 218 above the quartz chamber 208 in the Z-direction and one or more lower lamp modules 220 below the quartz chamber 208 in the Z-direction. In one embodiment, the upper lamp modules 218 and the lower lamp modules 220 are infrared lamps. Radiation from the upper lamp modules 218 and the lower lamp modules 220 travels through an upper quartz window 222 in the upper portion 210, and through a lower quartz window 224 in the lower portion 212.

One or more gases are provided to the processing volume 216 of the quartz chamber 208 by a gas injection assembly 230, and processing byproducts are removed from the process volume 216 by a gas exhaust assembly 232, which is typically in communication with a vacuum source (not shown).

The process kit 214 further includes multiple cylindrical liners. The multiple cylindrical lines include an inner liner 234 and an outer liner 236 that shield the processing volume 216 from side walls 242 of the housing structure 202. The inner liner 234 includes one or more inlet holes 264 on a side facing the gas injection assembly 230 in the −X direction (referred to as an "injection side" hereinafter) and one or more outlet holes 270 an a side facing the gas exhaust assembly 232 in the +X direction (referred to as an "exhaust side" hereinafter). The outer liner 236 includes one or more inlet holes 260 on the injection side and one or more outlet holes 272 on the exhaust side. A first heater 400A, serving as an inlet heater, is disposed between the inner liner 234 and the outer liner 236 on the injection side. A second heater 400B, serving as an exhaust heater, is disposed between the inner liner 234 and the outer liner 236 on the exhaust side.

The inner liner 234 acts as a cylinder wall to the process volume 216 that houses a cassette 246 having a plurality of shelves 248 (e.g., five shelves are shown in FIG. 2) to retain multiple substrates W for a batch multi-substrate process. The shelves 248 are interleaved between the substrates W retained in the cassette 246 so that a gap exists between the shelves 248 and the substrates W to allow efficient mechanical transfer of the substrates W to and from the shelves 248. A substrate W may be transferred into and from the processing volume 216 by a transfer robot, such as the transfer robots 110, 118 shown in FIG. 1, via a slit opening (not shown) formed in the outer liner 236 on a front side facing the −Y direction. In some embodiments, substrates W are transferred into and from the cassette 246 one by one. In some embodiments, the slit opening of the outer liner 236 is openable and closable by using a slit valve (not shown).

The process kit 214 further includes a top plate 250 and a bottom plate 252 that are attached to an inner surface of the inner liner 234 and enclose the cylindrical processing volume 216 within the process kit 214. The top plate 250 and the bottom plate 252 are disposed at a sufficient distance apart from the shelves 248 to allow gas flow over substrates W retained in the shelves 248.

The inner liner 234 is formed of transparent quartz, silicon-carbide (SiC) coated graphite, graphite, or silicon carbide (SiC). The top plate 250 and the bottom plate 252 are formed of transparent quartz, opaque quartz, silicon-carbide (SiC) coated graphite, graphite, silicon carbide (SiC), or silicon (Si), such that heat loss from the processing volume 216 through the top plate 250 and/or the bottom plate 252 is reduced. The shelves 248 of the cassette 246 disposed within the processing volume 216 are also formed of material, such as silicon-carbide (SiC) coated graphite, graphite, or silicon carbide (SiC). The outer liner 236 is formed of material having a high reflectivity, such as opaque quartz, and further reduce heat loss from the processing volume 216 within the process kit 214. In some embodiments, the outer liner 236 is formed in a hollow structure, in which vacuum between an inner surface of the outer liner 236 facing the inner liner 234 and an outer surface of the outer liner 236 facing the side walls 242 of the housing structure 202 reduces heat conduction through the outer liner 236.

The gases can be injected to the processing volume 216 from a first gas source 254, such as hydrogen (H$_2$), nitrogen (N$_2$), or any carrier gas, along with or without a second gas source 256 of the gas injection assembly 230 through the inlet holes 264 formed in the inner liner 234. The inlet holes 264 in the inner liner 234 are in fluid communication with the first gas source 254 and the second gas source 256 via an injection plenum 258 formed in the side wall 242 and the inlet holes 260 formed in the outer liner 236. The injected gases form gas flow along a laminar flow path 266. The inlet holes 260, 264 may be configured to provide gas flows with varied parameters, such as velocity, density, or composition.

The gases along the flow path 266 are configured to flow across the processing volume 216 into an exhaust plenum 268 formed in the side wall 242 to be exhausted by the gas exhaust assembly 232 from the processing volume 216. The gas exhaust assembly 232 is in fluid communication with the outlet holes 270 formed in the inner liner 234 via the outlet holes 272 formed in the outer liner 236, and the exhaust plenum 268, culminating the gases in an exhaust flow path 278. The exhaust plenum 268 is coupled to an exhaust or vacuum pump (not shown). At least the injection plenum 258 may be supported by an inject cap 280. In some embodiments, the processing chamber 200 is adapted to supply one or more liquids for processes, such as deposition and etch processes. Furthermore, although only two gas sources 254, 256 are shown in FIG. 2, the processing chamber 200 could be adapted to accommodate as many fluid connections as needed for the processes executed in the processing chamber 200.

The support system 204 includes components used to execute and monitor pre-determined processes in the processing chamber 200. A controller 206 is coupled to the support system 204 and is adapted to control the processing chamber 200 and support system 204.

The processing chamber 200 includes a lift-rotation mechanism 282 positioned in the lower portion 212 of the housing structure 202. The lift-rotation mechanism 282 includes a shaft 284 positioned within a shroud 286 to which lift pins (not shown) disposed through openings (not labeled) formed in the shelves 248 of the process kit 214 is coupled. The shaft 284 is movable vertically in the Z-direction to allow loading substrates W into and unloading substrates W from the shelves 248 through a slit opening (not shown) in the inner liner 234 and a slit opening not shown in the outer liner 236 by a transfer robot, such as the transfer robots 110, 118 shown in FIG. 1. The shaft 284 is also rotatable in order to facilitate the rotation of substrates W disposed within the process kit 214 in the X-Y plane during processing. Rotation of the shaft 284 is facilitated by an actuator 288 coupled to the shaft 284. The shroud 286 is generally fixed in position, and therefore, does not rotate during processing.

The quartz chamber 208 includes peripheral flanges 290, 292 that are attached to and vacuum sealed to the side walls 242 of the housing structure 202 using O-rings 294 or other sealing mechanisms. The peripheral flanges 290, 292 may all be formed from an opaque quartz to protect O-rings 294 from being directly exposed to the heat radiation. The peripheral flange 290 may be formed of an optically transparent material such as quartz.

In the example embodiments described herein, the process kit 214 includes one or more heaters 400A, 400B disposed between the inner liner 234 and the outer liner 236 that improves temperature uniformity over each substrate W retained in the shelves 248 in the processing volume 216 by compensating for or reducing heat loss from the processing volume 216 in the vicinity of edges of the substrates W.

Figure 3:
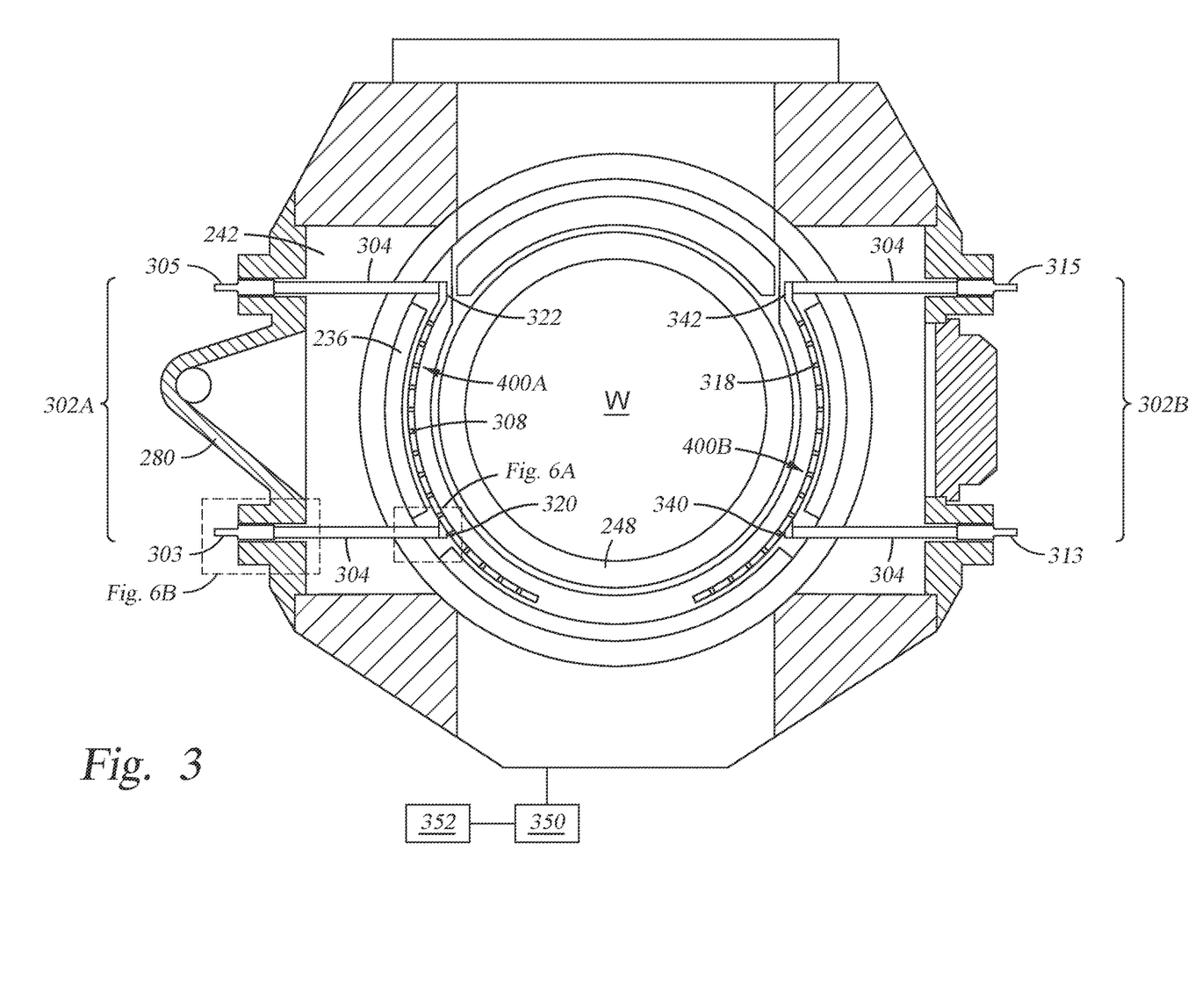
FIG. 3 is a schematic cross-sectional plan view of the processing chamber of FIG. 2.

FIG. 3 is a schematic cross-sectional plan view of the processing chamber 200 of FIG. 2. The processing chamber 200 includes a first heating assembly 302A and a second heating assembly 302B. The first heating assembly 302A includes the first heater 400A, two or more heater rods 304, and two or more sockets 303, 305. The second heating assembly 302B includes the second heater 400B, two or more heater rods 304, and two or more sockets 313, 315. The first heater 400A is an inlet heater and is disposed adjacent the inlet holes 260, 264 (FIG. 2). The second heater 400B is an outlet heater and is disposed adjacent the outlet holes 270, 272 (FIG. 2). A plurality of heater rods 304 are configured to couple the first heater 400A and the second heater 400B to sockets 303, 305, 313, 315.

Each of the first heater 400A and the second heater 400B are disposed inward of the outer liner 236 and the side walls 242. The first heater 400A and the second heater are curved coils of a resistive heating element. The first heater 400A and the second heater 400B are curved such that a first side is concave. The heater rods 304 are coupled to the sides of the first heater 400A and the second heater 400B opposite the concave side. The heater rods 304 extend through at least a portion of the side walls 242 and the outer liner 236. The heater rods 304 electrically couple the first heater 400A and the second heater 400B to each of the sockets 303, 305, 313, and 315.

The first heater 400A is coupled to a first heater rod of the heater rods 304 at a first heater to heater rod connection point 320 and a second heater rod of the plurality of heater rods 304 at second heater to heater rod connection point 322. The second heater 400B is coupled to a third heater rod of the heater rods 304 at a third heater to heater rod connection point 340 and a fourth heater rod of the heater rods 304 at a fourth heater to heater rod connection point 342. Each of the heater rods 304 are capable of providing electrical connections to the heaters 400A, 400B. Each of the heater rods 304 are coupled to one of the first heater 400A or the second heater 400B by screwing the heater rods 304 into the first heater 400A and the second heater 400B as connection points described herein.

The heater rods 304 provide an electrical path to the heaters 400A, 400B and minimize heat losses which may occur through the side walls 242. The heater rods 304 are electrically and thermally coupled to the heaters 400A, 400B at a distal end of each heater rod 304. Each heater rod 304 is coupled to a socket, such as one of the sockets 303, 305, 313, 315 shown herein. Each of the heater rods 304 are coupled to a socket at a distal end of the heater rod 304. The cross sectional area of each heater rod 304 is greater than the cross sectional area of each portion of the coil of the heaters 400A, 400B. The difference in cross sectional area reduces the internal energy generated within the heater rod 304 caused by the passage of electricity therethrough.

The heaters 400A, 400B are adapted to heat the edges of the substrates W retained in the shelves 248 and are used in combination with the upper lamp modules 218 and the lower lamp modules 220 to compensate for heat losses from the processing volume 216 in the vicinity of the inner liner 234 (FIG. 2). The combination of the heaters 400A, 400B, the upper lamp modules 218, and the lower lamp modules 220 improves the temperature uniformity throughout the substrates W and improves pre-clean operations.

In some embodiments, temperatures of the edges of the substrates W can be tuned to a predetermined temperature by adjusting the power delivered to the heaters 400A, 400B. Each heater 400A, 400B is powered by a separate power source, and each power source is independently controlled by a phase angle semiconductor controlled rectifier (SCR) controller. One or both of the heaters 400A, 400B are controlled in an open loop and/or one or both of the heaters 400A, 400B are controlled in a closed loop using a temperature sensor 350 communicatively coupled to the SCR controller 352. The temperature sensor 350, such as a pyrometer, is configured to monitor a temperature of one or more substrates W disposed within the cassette. The SCR controller 352 receives the temperature data from the temperature sensor 350 and controls the power to each of the heaters 400A, 400B based on the temperature of the one or more substrates W. In particular, the substrates W disposed in the center of cassette 246 between the top plate 250 and the bottom plate 252 is heated by the first heater 400A and the second heater 400B.

The first heater 400A and the second heater 400B provide uniform heating to substrates W disposed from the top to the bottom of the cassette 246 as well as facilitate uniform heating from the center to the edge of each of the substrates W. Heat is radiantly transferred from the heaters 400A, 400B to the substrates W and/or heat is convectively transferred to gas flowing from the injection assembly 230 to the gas exhaust assembly 232. The individual SCR controllers 352 are used to adjust one or more of the heaters 400A, 400B in order to compensate for non-uniform losses of energy to and from the side walls 242 and produce an isothermal vessel for multi-substrate batch processing. Each of the first heater 400A and the second heater 400B are configured to individually output energy at a rate of about 3 KW to about 10 KW. However, other power ranges are also contemplated.

Openings 308, 318 (e.g., slits) in the heaters allow flow of the gases between the inlet holes 260 of the outer liner 236 and the outlet holes 272 of the outer liner 236 without obstruction. The heaters 400A, 400B also provide a barrier to inhibit heat loss from the cassette 246. The first heater 400A includes a first heater rod 304 coupled to a first end of the coil of the first heater 400A at the first heater to heater rod connection point 320 and a second heater rod 304 coupled to a second end of the coil of the first heater 400A at the second heater to heater rod connection point 322. The second heater 400B includes a first heater rod 304 coupled to a first end of the coil of the second heater 400B at the third heater to heater rod connection point 340 and a second heater rod 304 coupled to a second end of the coil of the second heater 400B at the fourth heater to heater rod connection point 342. Although two heater to heater rod connection points 320, 322, 340, 342 are shown per heater 400A, 400B, it is contemplated each heater 400A, 400B may include multiple heater sections. Each individual heater section of the heaters 400A, 400B may have additional heater to heater rod connection points or may be coupled to another heater section.

Figure 4A:
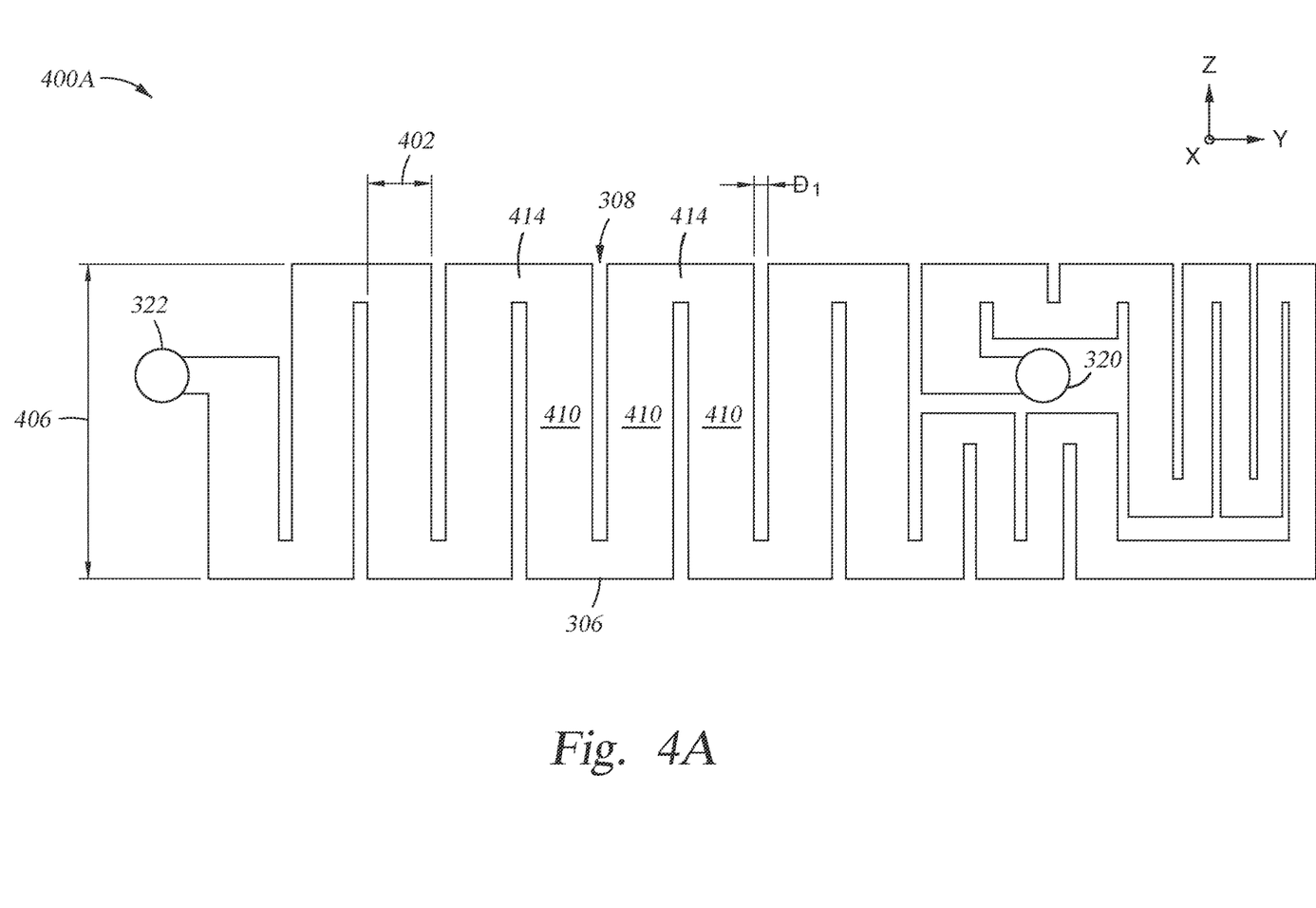
FIGS. 4A-4B are schematic side views of process chamber heating elements according to one embodiment.
Figure 4B:
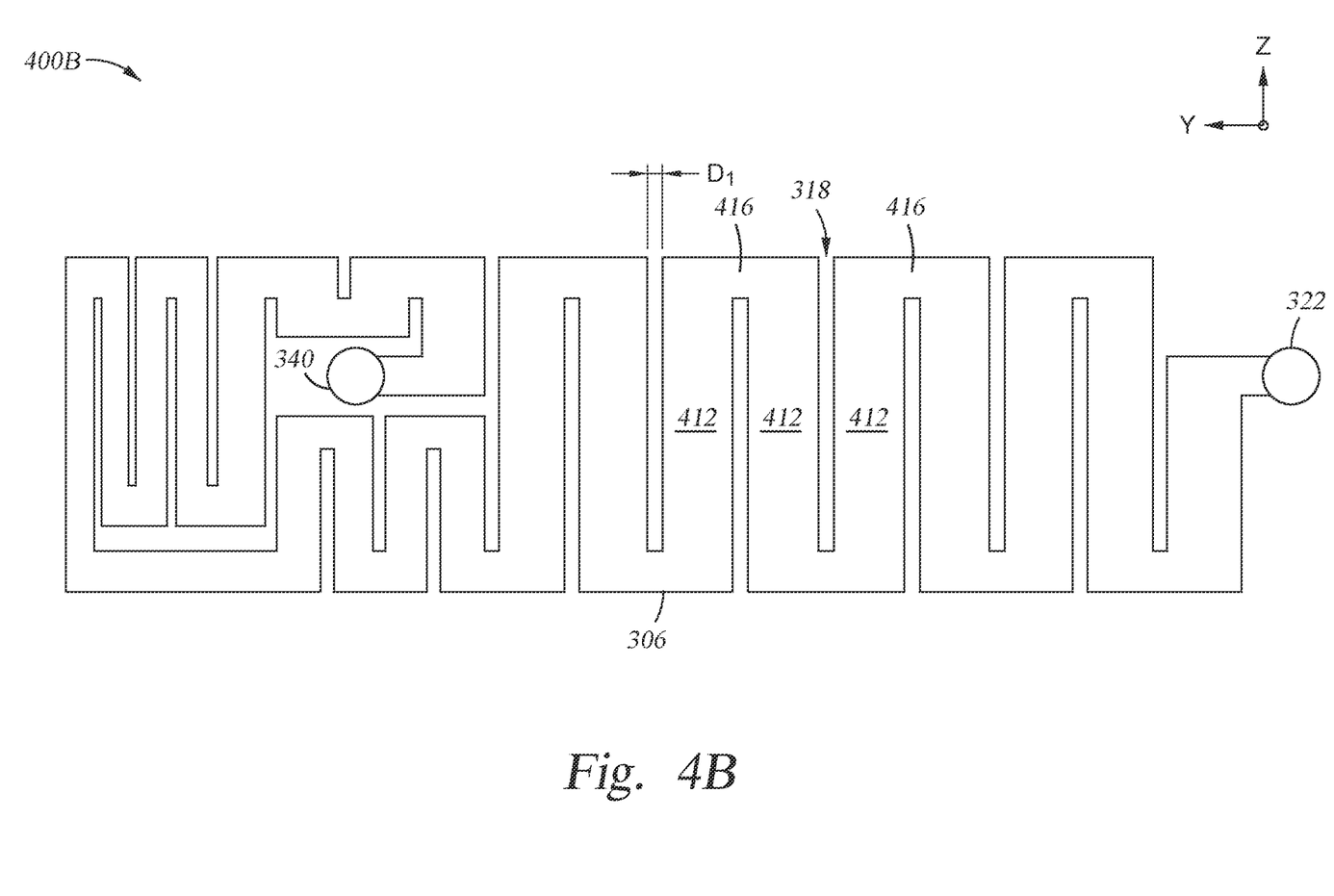

FIGS. 4A-4B are schematic side views of process chamber heater elements according to one embodiment. FIG. 4A illustrates a side view of the first heater 400A. FIG. 4B illustrates a side view of the second heater 400B. Each of the heaters 400A, 400B are curved to wrap around at least a portion of the circumference of the processing volume 216.

As shown in FIG. 3, the two heaters 400A, 400B are disposed opposite one another and at least partially surround the inner liner 234 and the cassette 246. Additional heaters (not shown) may be disposed around other portions of the circumference of the processing volume 216. The first heater 400A is disposed on the injection side and the second heater 400B is disposed on the exhaust side. The first heater 400A surrounds an arc portion of the perimeter of the cassette 246. The arc portion of the first heater 400A extends about 20 degrees to about 180 degrees around the cassette 246, such as about 95 degrees to about 100 degrees around the cassette 246.

Each of the heaters 400A, 400B are composed of continuous coils 306, 316. The coils 306, 316 are disposed in a serpentine arrangement and include a plurality of turns and bends. The continuous coils 306, 316 include vertical portions 410, 412 disposed parallel with one another and horizontal portions 414, 416 disposed parallel one another. Current from a power source (not shown) flows through the vertical portions 410, 412 and resistively heats the coils 306, 316. The coils 306, 316 are disposed close enough and have a large enough current going therethrough that the material of the coils 306, 316 is heated. This heating is further amplified by the coils 306, 316 acting as induction coils. The material of the coils 306, 316 is a carbon based material, such that the resistivity of the coil material is about 500 $\Omega\cdot$cm to about 1500 $\Omega\cdot$cm, such as about 750 $\Omega\cdot$cm to about 1250 $\Omega\cdot$cm. In some embodiments, the coils 306, 316 are formed of a graphite material. Other materials which form the coils 306, 316 may include paralytic graphite and silicon carbide. The paralytic graphite and silicon carbide may include alternative resistivity ranges. In some embodiments, the heaters 400A, 400B are permanently coupled to the heater rods 304, such that each heater 400A, 400B includes a coil 306, 316 and two heater rods 304 formed as a single component. In some embodiments each of the coils 306, 316 and the two corresponding heater rods 304 are formed from one piece of material, such as one piece of graphite and are not screwed together separately.

The vertical portions 410, 412 are spaced apart and form openings 308, 318 between vertical portions 410, 412 of the coils 306, 316. The openings 308 of the first heater 400A and the openings 318 of the second heater 400B are configured to be in fluid communication with the gas injection assembly and the exhaust injection assembly respectively. The openings 308, 318 are in the form of slits extending in parallel to the vertical portions 410, 412, allowing efficient heat generation and flow of the gases through the inner liner 234. Spatial arrangement and sizes of the plurality of slits can be adjusted to provide desired temperature gradients. In one example, the heaters 300A, 300B each have a total coil length (e.g., total distance between heater rod connection points 320, 340 and heater rod connection points 322, 342 along the coil path) of about 1,000 mm and about 3,500 mm, such as about 2,700 mm; a coil width 402 (e.g., width of a vertical portion of the coil) of about 6 mm to about 10 mm; a thickness of about 4 mm and about 8 mm; and a height 406 of about 25 mm and about 150 mm. Each of the first heater 400A and the second heater 400B are curved and have a similar central axis. In embodiments described herein, the outer radius of curvature of each of the first heater 400A and the second heater 400B is about 310 mm to about 500 mm, such as about 360 mm to about 460 mm. The slit widths $D_1$ between each of the vertical portions 410, 412 is about 1 mm to about 5 mm, such as about 1 mm to about 3 mm, such as about 1.5 mm to about 2.5 mm.

Each of the first heater rod connection points 322, 342 are disposed on an extreme end of the arc formed by the first heater 400A and the second heater 400B respectively. Each of the second heater rod connection points 320, 340 are disposed inside of the arc and include a portion of the coils 306, 316 disposed around the second heater rod connection points 320, 340.

Figure 5:
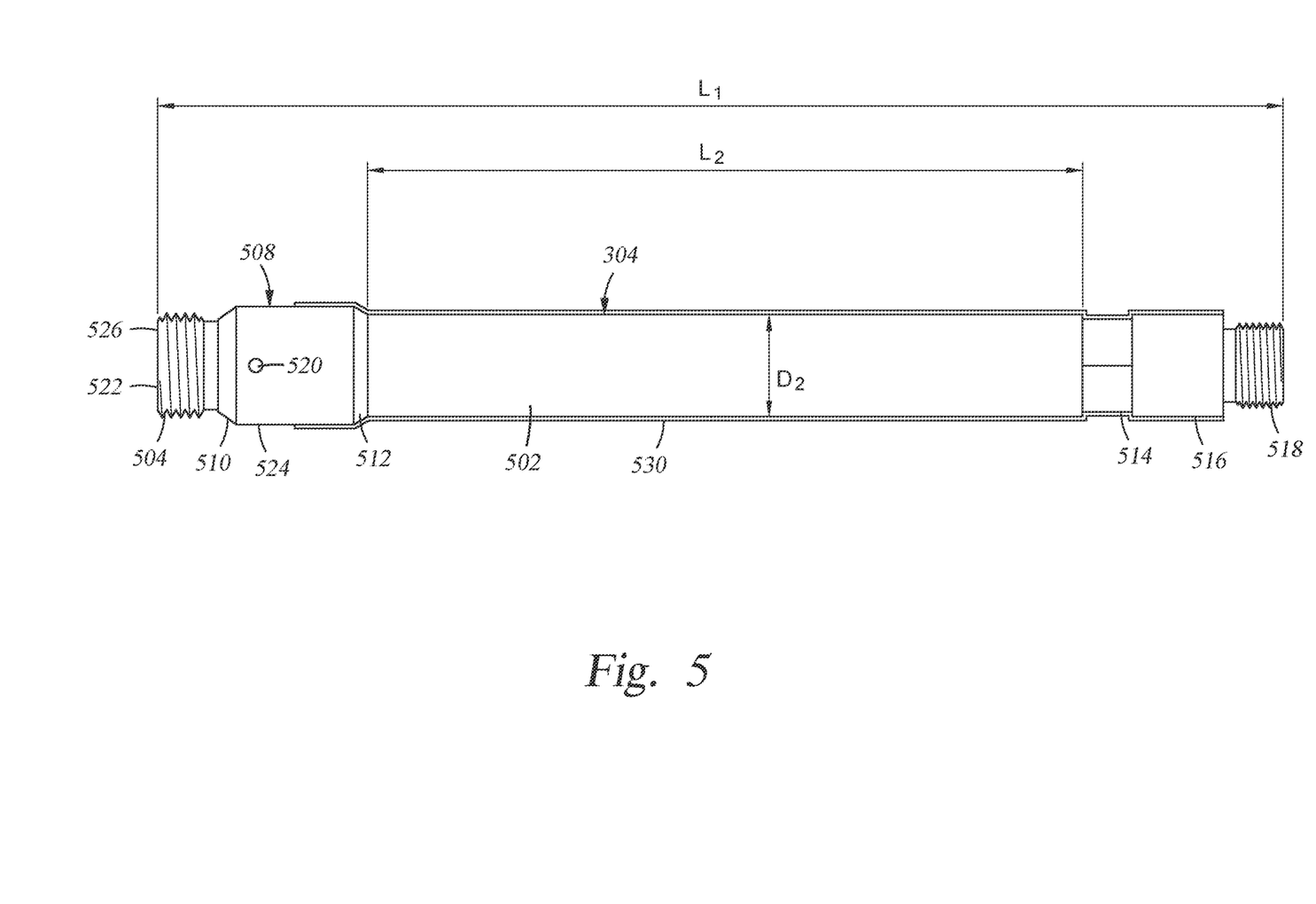
FIG. 5 is a schematic side view of a heater rod according to one embodiment.

FIG. 5 is a schematic side view of a heater rod 304 according to one embodiment. The heater rod 304 is a similar material to the coils 306, 316. The heater rod 304 may have a resistivity of about 500 Ω·cm to about 1500 Ω·cm, such as about 750 Ω·cm to about 1250 Ω·cm. Other materials which form the coils 306, 316 may include paralytic graphite and silicon carbide. The paralytic graphite and silicon carbide may include alternative resistivity ranges. In some embodiments, the heater rods 304 are formed of a graphite material. The heater rods 304 are configured to provide power to the first heater 400A and the second heater 400B.

The heater rods 304 have a total length $L_1$ of about 100 mm to about 250 mm, such as about 150 mm to about 225 mm, such as about 175 mm to about 200 mm. The heater rods 304 are configured to extend through openings within the side walls 242 (FIG. 2) of the processing chamber 200. The heater rods 304 include a central shaft 502, which extends through the side walls 242. The central shaft 502 has a diameter $D_2$ of about 10 mm to about 15 mm, such as about 10 mm to about 13 mm, such as about 11 mm to about 12 mm. The central shaft 502 has a central length $L_2$ of about 140 mm to about 175 mm, such as about 150 mm to about 160 mm.

The central shaft 502 is a cylindrical shaft and is linear. The heater rods 304 each further include a fastening section 514, a shaft extension 516, and a first threaded section 518 disposed on the one distal end of the central shaft 502. The fastening section 514 is connected to the central shaft 502 and disposed between the central shaft 502 and the shaft extension 516. The fastening section 514 is a non-cylindrical section and includes a plurality of planar surfaces extending between the central shaft 502 and the shaft extension 516. Each of the planar surfaces are configured to enable gripping of the fastening section 514 using a wrench or other tightening device. In embodiments described herein, the fastening section 514 includes six sides and is configured to enable turning of the heater rod 304 using a hex wrench. In yet other embodiments, the fastening section 514 includes three or more sides, such as four sides, five sides, six sides, seven sides, eight sides, nine sides, or ten sides. In some embodiments, the distance between two parallel sides of the fastening section 514 is about 8 mm to about 12 mm, such as about 9 mm to about 12 mm, such as about 10 mm to about 11 mm. The maximum diameter of the fastening section 514 is less than the diameter of the central shaft 502.

On the opposite side of the fastening section 514 from the central shaft 502 is the shaft extension 516. The shaft extension 516 has a similar or smaller diameter than the central shaft 502 and is cylindrical in shape. In embodiments described herein, the diameter of the shaft extension 516 is the same as the diameter of the central shaft 502. The fastening section 514 is disposed between the central shaft 502 and the shaft extension 516 to enable a technician or tool to better reach the fastening section 514 with a wrench or other fastening device. The diameters of the fastening section 514 and the shaft extension 516 are equal to or smaller than the diameter of the central shaft 502 to enable the end of the heater rod 304 with the fastening section 514 and the shaft extension 516 to be inserted through a hole within the side wall 242. The hole is sized to receive the heater rod 304 and is similar in size to the central shaft 502 to enable the heater rod 304 to be pushed therethrough, but minimize heat loss through the hole.

The first threaded section 518 is disposed on the distal end of the shaft extension 516 furthest from the fastening section 514. The first threaded section 518 also has a diameter equal to or less than the diameter of the central shaft 502. The first threaded section 518 as described herein has a diameter less than the diameter of the central shaft 502. In some embodiments, the first threaded section 518 includes a male threaded outside surface to enable the first threaded section 518 to be inserted into and coupled to each of the heater rod connection points 320, 322, 340, 342 of the first heater 400A and the second heater 400B. In embodiments described herein, the first threaded section 518 is a ¼-16 thread to a ½-16 thread, such as a ⅜-16 thread.

On the opposite distal end of the central shaft 502 from the fastening section 514, the shaft extension 516, and the first threaded section 518 is a dilated section 508. The dilated section 508 is connected to the central shaft 502 by a first chamfered surface 512. The first chamfered surface 512 extends between a distal end of the central shaft 502 and a distal end of the dilated section 508. The first chamfered surface 512 forms a transition portion of the shaft between the central shaft 502 and the dilated section 508, such that the first chamfered surface 512 forms a conical frustum, with the smaller diameter end connected to the central shaft 502 and the larger diameter end connected to the dilated section 508. The dilated section 508 has a larger diameter than the central shaft 502. The dilated section 508 had a diameter of about 13 mm to about 20 mm, such as about 15 mm to about 18 mm. The dilated section 508 is a cylindrical section extending from the central shaft 502. The dilated section 508 includes a passage 520 disposed therethrough. The passage 520 is disposed from one side of the dilated section 508 to another side of the dilated section 508, such as the opposite side of the dilated section 508. The passage 520 acts as a vent hole for gas run through the dilated section 508. The gas run through the dilated section 508 may reduce the buildup of methane or other byproducts within the heater rod 304. A second passage 522 is disposed through the end surface 526 of the heater rod 304. The end surface 526 is disposed on the distal end of the second threaded section 504 furthest from the central shaft 502. The second passage 522 connections to the first passage at a perpendicular angle (FIG. 6B) and assists in reducing methane buildup or other contaminant buildup around the end of the heater rod 304.

At the distal end of the dilated section 508 furthest from the central shaft 502, a second chamfered surface 510 is disposed. The second chamfered surface 510 reduces in diameter as the second chamfered surface 510 moves away from the dilated section 508. The second chamfered surface 510 also forms a conical frustum and is coupled at a larger end to the dilated section 508 and a smaller end to a second threaded section 504. Each of the first chamfered surface 512 and the second chamfered surface 510 are disposed at about a 20 degree to about a 60 degree angle with respect to the outer surface 524 of the dilated section 508. The second threaded section 504 is disposed at an opposite end of the heater rod 304 from the first threaded section 518. The second threaded section 504 has a larger diameter than the first threaded section 518. The outer surface of the second threaded section 504 is a male threaded surface, such that the second threaded section 504 may be screwed into and secured to a socket, such as one of the sockets 303, 305, 313, 315 (FIG. 3). The second threaded section 504 is disposed at the distal end of the heater rod 304 and has a thread of ¼-20 UNF to about ¾-20 UNF, such as about ½-20 UNF. Each end of the second threaded section 504 includes about a 45 degree to about a 75 degree wedge, such as about a 60 degree wedge.

A coating 530 is disposed on the entire surfaces of each of the shaft extension 516, the fastening section 514, the central shaft 502, the first chamfered surface 512, and part of the outer surface 524 of the dilated section 508. The coating 530 stops on the dilated section 508 before reaching the passage 520 or the second chamfered surface 510. The coating 530 is disposed on the heater rod 304 to reduce exposure of the material of the heater rod 304 to the precursors utilized within the processing chamber 200. The coating 530 as described herein is either a silicon carbide (SiC) coating or a Pyrolytic Boron Nitride (pBN) coating. While it is envisioned other coating may also be used to protect the surfaces of the heater rod 304, SiC and pBN have been shown to have low reactivity with process precursors and maintain good properties at high processing temperatures. The coating 530 does not cover either of the first threaded section 518 or the second threaded section 504, so that the ability of the threaded sections 518, 504 to couple to other components is not compromised. The coating 530 may further not cover sections of the heater rod 304 which contain openings, such as the passages 520, 522 or sections which are disposed inside of connections to the heater. In some embodiments, the coating 530 is only disposed on a portion of the shaft extension 516. Only coating a portion of the shaft extension 516 allows the shaft extension 516 to be disposed within and in contact with a portion of the connection points 320, 322, 340, 342.

Figure 6A:
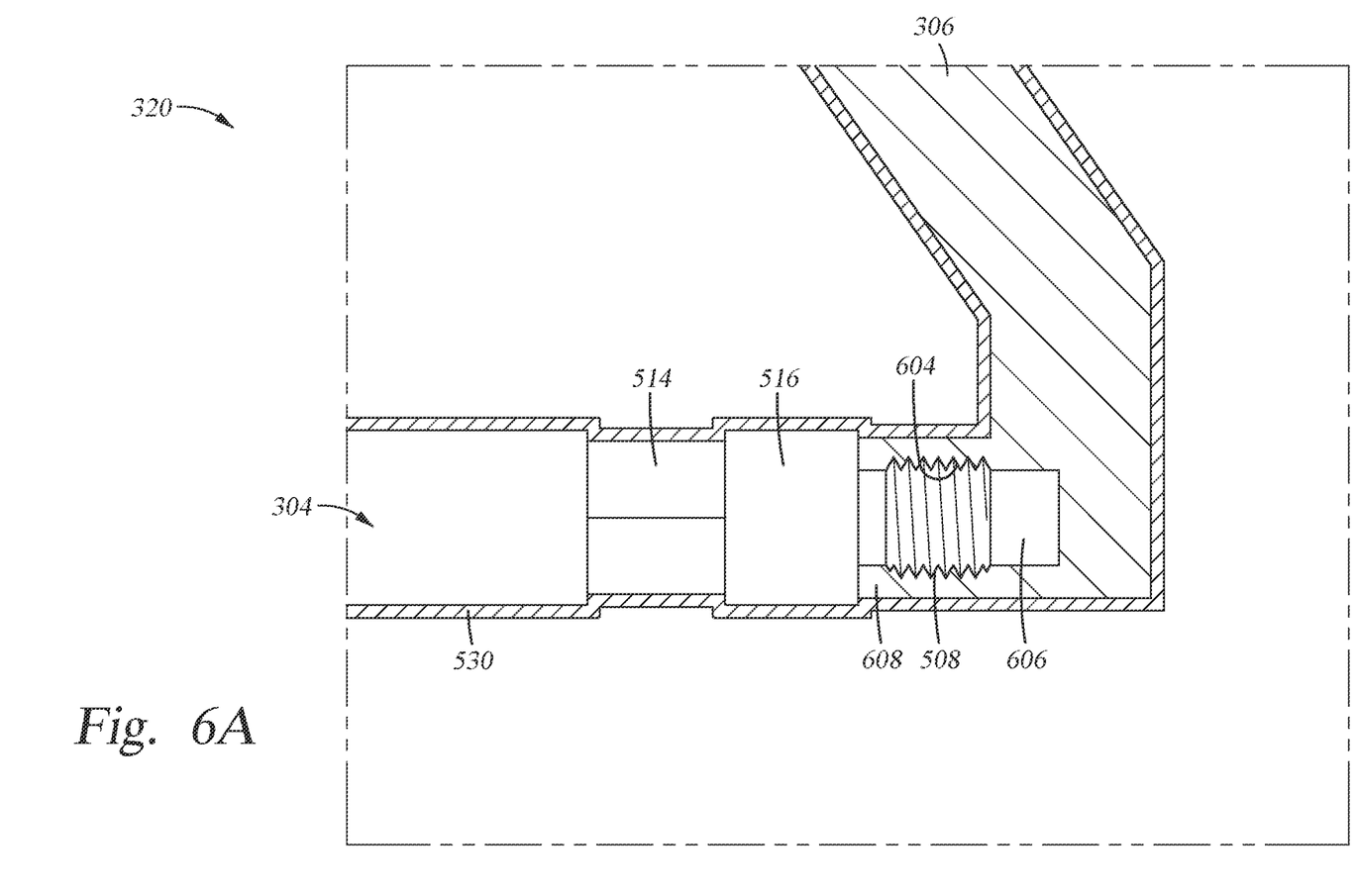
FIG. 6A is schematic cross-sectional view of the heater rod to heating element connection point.

FIG. 6A is schematic cross-sectional view of one of the connection points 320, 322, 340, 342. FIG. 6A specifically illustrates the first heater to heater rod connection point 320. Each of the connection points 320, 322, 340, 342 are similar in structure and function. The first heater to heater rod connection point 320 includes a protrusion 608 protruding from one end of the coil 306. The protrusion 608 is disposed on a distal end of the coil 306 and includes a cavity 606 disposed therein. The cavity 606 includes female heater threads 604. The female heater threads 604 is a female threaded section disposed in at least a portion of the cavity 606. The female heater threads 604 enable the first threaded section 518 to be threaded therein. The first threaded section 518 and the female heater threads 604 are matched to enable easy connection of a heater rod 304 to the first heater 400A. In some embodiments, the heater rod 304 does not completely fill the cavity 606 and the cavity 606 includes open space. In some embodiments, in the presence of hydrogen ($H_2$) the higher temperature areas of the heater 400A and the heater rod 304 is prone to methane formation, which may contaminate the substrates and/or erode the graphite used to form the first heater 400A and the heater rod 304. High temperature areas include the connection between the heater rod 304 and the heater 400A at the first heater to heater rod connection point 320. The apparatus described herein assist in reducing the methane production and/or removing the produced methane from the area surrounding the heater rod 304.

To further assist in reducing the escape of methane into the processing chamber 200 and to reduce the reaction between the heaters 400A, 400B and the heater rods 304, the heaters 400A, 400B and the heater rods 304 are coated with the coating 530 after the heater rods 304 are connected to the heaters 400A, 400B.

Figure 6B:
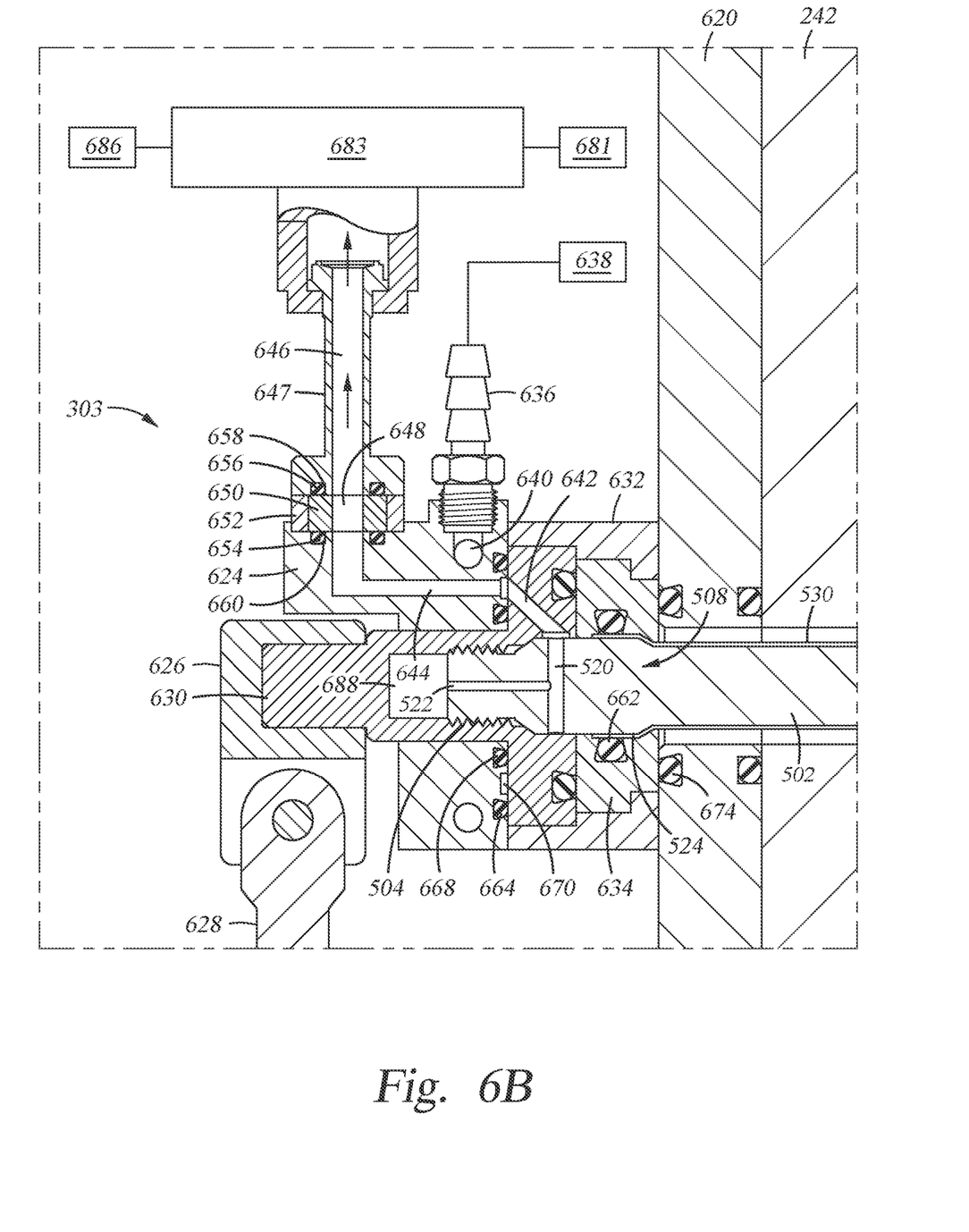
FIG. 6B is a schematic cross-sectional view of a heater rod to socket connection point.

FIG. 6B is a schematic cross-sectional view of one of the sockets 303, 305, 313, 315 when the heater rods 304 are disposed therein. In the embodiment of FIG. 6B, a first socket 303 of the sockets 303, 305, 313, 315 is described. Each of the sockets 303 are similar in apparatus and function. As shown herein, the heater rod 304 is disposed through the side wall 242 of the processing chamber 200 and through an opening. The socket 303 is coupled to an inject cap 620 disposed on the side wall 242. The inject cap 620 further includes an opening wherein the heater rod 304 is disposed therethrough. The inject cap 620 may be similar to the inject cap 280 of FIGS. 2 and 3 and includes openings through which one or more heater rods 304 are disposed. The socket 303 is configured to electrically couple the heater rod 304 to a power source (not shown) via a power line 628. The socket 303 electrically couples the heater rod 304 to the power line 628 and includes apparatus for cooling the distal end of the heater rod 304 and removing contaminants, such as methane.

The socket 303 includes the power line 628 coupled to a feedthrough 630. The feedthrough 630 is coupled to a cooling plate 624. The heater rod 304 is disposed within and screwed into the feedthrough 630 at one distal end. A feedthrough insulator 634 is disposed between the feedthrough 630 and the inject cap 620 to isolate the feedthrough from the inject cap 620. The feedthrough insulator 634 is also disposed around a portion of the heater rod 304. A feedthrough spacer 632 is disposed around the feedthrough insulator 634 and at least a portion of the feedthrough 630.

The heater rod 304 is connected to the feedthrough 630 at the distal end furthest from the first heater to heater rod connection point 320. The feedthrough 630 is configured to be disposed around the second threaded section 504 and a portion of the dilated section 508 of the heater rod 304. The feedthrough 630 is shaped to surround the second threaded section 504 and the portion of the dilated section 508, such that the heater rod 304 is disposed within a cavity 688 within the feedthrough 630. The cavity 688 includes a female threaded section for the second threaded section 504 of the heater rod 304 to be threaded therein. The cavity 688 includes a volume at the end of the heater rod 304 and in fluid communication with the second passage 522.

The passage 520 disposed through the dilated section 508 of the heater rod 304 is in fluid communication with a feedthrough inert gas passage 642. The feedthrough inert gas passage 642 is disposed through the feedthrough 630 and is in fluid communication with both the passage 520 of the heater rod 304 at an opening of the feedthrough inert gas passage 642. In some embodiments the opening is a round hole or opening formed in the surface of the feedthrough 630. In other embodiments, the feedthrough inert gas passage 642 circumscribes a portion of the cavity 688 in which the heater rod 304 is disposed. Circumscribing a portion of the cavity 688 enables the feedthrough inert gas passage 642 to align with one of the openings of the passage 520 even if the passage 520 is not in a perfect (e.g., vertical) alignment as shown. In some embodiments, the feedthrough inert gas passage 642 circumscribes at least 90 degrees of the circumference of the heater rod 304, such as at least 120 degrees, such as at least 180 degrees. In some embodiments, the feedthrough inert gas passage 642 is an arc which surrounds about 180 degrees of the circumference of the cavity 688. The feedthrough inert gas passage 642 is a diagonal passage and is disposed at an angle other than about 0 degrees and about 90 degrees from the outer surface 524 of the dilated section 508. In some embodiments, the feedthrough inert gas passage 642 extends at an angle of about 20 degrees to about 70 degrees from the outer surface 524 of the dilated section 508 of the heater rod 304. The feedthrough inert gas passage 642 connects a surface of the feedthrough 630 contacting the heater rod 304 and a surface of the feedthrough 630 contacting the cooling plate 624.

The feedthrough inert gas passage 642 connects the passage 520 and a cooling plate inert gas passage 644 disposed through the cooling plate 624. The cooling plate inert gas passage 644 includes a connection channel 670. The connection channel 670 is disposed within the surface of the cooling plate 624 between the cooling plate 624 and the feedthrough 630. The connection channel 670 is fluidly coupled to both the feedthrough inert gas passage 642 and the cooling plate inert gas passage 644. The connection channel 670 is a ring disposed around a surface of the cooling plate 624, which contacts the feedthrough 630. The connection channel 670 forms a ring to enable fluid communication between the feedthrough inert gas passage 642 and the cooling plate inert gas passage 644 even if the feedthrough inert gas passage 642 is disposed at a position other than the position shown in FIG. 6B. In some embodiments, the feedthrough inert gas passage 642 is disposed on the lower portion of the feedthrough 630 shown, but is still in fluid communication with the cooling plate inert gas passage 644 because of the connection channel 670.

As described herein, the feedthrough 630 comprises a metal material or a metal alloy to enable conduction of electricity between the power source and the heater rod 304. The feedthrough 630 in some embodiments is a nickel feedthrough. The feedthrough 630 being formed of a nickel material has been found to provide adequate electrical conductivity, is easy to machine, and does not react with the heater rod 304 material or the purge gases.

The cooling plate inert gas passage 644 is disposed through the cooling plate 624 and configured to be fluidly coupled to an insulator passage 648 and a conduit passage 646. The insulator passage 648 is disposed through a cooling plate insulator 650 coupled to the top of the cooling plate 624. The cooling plate insulator 650 electrically and thermally insulates the cooling plate 624 from a conduit 647, such that the conduit 647 is electrically and isolated from the power line 628 and thermally isolated from the cooling plate 624. The cooling plate insulator 650 is surrounded by a cooling plate spacer 652, which further separates the cooling plate 624 from the conduit 647. The cooling plate insulator 650 is formed of an electrically insulated material. In embodiments described herein, the cooling plate insulator 650 is a material such as quartz, glass, or a ceramic. The embodiment of FIG. 6B utilizes a quartz cooling plate insulator 650.

The cooling plate spacer 652 is formed of a polymer or plastic material. In embodiments described herein, the cooling plate spacer 652 is formed of a Polyether ether ketone (PEEK) material. The PEEK material allows for the cooling plate spacer 652 to undergo significant force and elevated temperature without degradation.

A seal is formed between the cooling plate 624 and the cooling plate insulator 650 by a sealing ring 654 disposed in a sealing ring groove 660. A seal is formed between the cooling plate insulator 650 and the conduit 647 by a sealing ring 656 disposed in a sealing ring groove 658. The seals formed by the sealing ring 654 and the sealing ring 656 form a sealed passage between the cooling plate inert gas passage 644 and the conduit passage 646. The conduit passage 646, the insulator passage 648, the cooling plate inert gas passage 644, and the feedthrough inert gas passage 642 are all in fluid communication to allow inert gas to be supplied to the passage 520 disposed through the heater rod 304. Contaminants such as methane are also removed via the conduit passage 646, the insulator passage 648, the cooling plate inert gas passage 644, and the feedthrough inert gas passage 642.

A seal is formed between the connection channel 670 and the feedthrough inert gas passage 642. The seal is formed by a first sealing ring 668 and a second sealing ring 664 disposed within grooves within the cooling plate 624. The first sealing ring 668 is disposed inside of the connection channel 670, while the second sealing ring 664 is disposed outside of the connection channel 670. The area between the first sealing ring 668 and the second sealing ring 664 is sealed to enable fluid to flow from the connection channel 670 to the feedthrough inert gas passage 642 without interacting with outside contaminants.

A cooling passage 640 is disposed through the cooling plate 624. The cooling passage 640 delivers a cooling fluid from a cooling fluid source 638 to the cooling plate 624. The cooling passage 640 and the cooling fluid circulated therein cool the cooling plate 624 and assists in maintaining a low temperature at the end of distal end of the heater rod 304 disposed within the feedthrough 630. The temperature of the feedthrough 630 is also maintained by the cooling passage 640. The cooling passage 640 is connected to the cooling fluid source 638 at a cooling fluid line connection 636. The cooling fluid line connection 636 is configured to be coupled to a cooling fluid line. A feedthrough insulator 634 is disposed between the feedthrough 630 and the inject cap 620. The feedthrough insulator 634 electrically and thermally insulates the feedthrough 630 from the inject cap 620, such that the inject cap 620 is electrically isolated from the feedthrough 630 and the power line 628 and thermally isolated from the feedthrough 630.

The feedthrough insulator 634 is a ring with an opening disposed therethrough. The feedthrough insulator 634 includes a groove for a sealing ring 662 disposed in the inner surface of the opening. The sealing ring 662 within the feedthrough insulator 634 fluidly seals the area surrounding the distal end of the heater rod 304 disposed within the feedthrough 630 from the area surrounding the rest of the heater rod 304. As the sealing ring 662 is in contact with the heater rod 304, the sealing ring 662 is subjected to high temperatures and extreme process conditions. Therefore, the sealing ring 662 described herein may be a high durability sealing ring. The sealing ring 662 is a polymer or plastic with a hardness of greater than 50 duro, such as greater than 60 duro, such as about 65 duro. In some embodiments, the sealing ring 662 is described as a heater rod sealing ring. A seal is formed between the feedthrough insulator 634 and the inject cap 620 by a sealing ring 674 disposed in a groove on the outer surface of the inject cap 620. The sealing ring 674 prevents gas from around the heater rod 304 from escaping to the atmosphere surrounding the socket 303.

The outer radial surface of the feedthrough insulator 634 is surrounded by the feedthrough spacer 632. The feedthrough spacer 632 is similar to the cooling plate spacer 652, but separates the feedthrough 630 and the cooling plate 624 from the inject cap 620. The feedthrough spacer 632 is a ring surrounding the feedthrough insulator 634.

The feedthrough insulator 634 is formed of an electrically insulated material. In embodiments described herein, the feedthrough insulator 634 is a material such as quartz, glass, or a ceramic. The embodiment of FIG. 6B utilizes a quartz feedthrough insulator 634. The feedthrough spacer 632 is formed of a polymer or plastic material. In embodiments described herein, the feedthrough spacer 632 are formed of a Polyether ether ketone (PEEK) material. The PEEK material allows for the feedthrough spacer 632 to undergo significant force and elevated temperature without degradation. The inject cap 620 includes a metal or metal alloy, such as stainless steel or aluminum.

A cap 626 couples the power line 628 to the feedthrough 630. The cap 626 surrounds a protruding part of the feedthrough 630 and clamps onto the feedthrough 630. The power line 628 is coupled to the cap 626, such that when the cap 626 is connected to and disposed on the feedthrough 630, power may be supplied to the feedthrough 630 via the power line 628. The feedthrough 630 subsequently supplies power to the heater rod 304 and the heaters 400A, 400B. The cap 626 is a metal material or a metal alloy, or other electrically conductive material. In embodiments described herein, the cap 626 is a copper cap, such as a nickel plated copper cap 626.

Each of the sealing rings 654, 656, 664, 668, 674 described herein are a polymer or plastic ring. In some embodiments, the sealing rings 653, 565, 664, 668, 674 are silicone rings, fluorocarbon rubber (FPM) rings, polytetrafluoroethylene (PTFE) rings, or perfluoroelastomer rings. Other sealing ring materials may also be utilized. The sealing rings 654, 656, 664, 668, 674 described herein may be o-rings or other sealing gaskets. The sealing rings 654, 656, 664, 668, 674 may have a hardness of greater than 50 duro, such as greater than 60 duro, such as about 65 duro.

As shown herein, a purge gas, such as hydrogen ($H_2$) or Argon (Ar), is supplied by a purge gas source 681, flown through a purge gas conduit 683, and to a downstream portion 686 of a gas vent system. The downstream portion 686 is downstream of the processing chamber 200, such as after the exhaust, to reduce the potential for contaminants removed from the area surrounding the heater rod 304 from contaminating a substrate disposed within the processing chamber 200. During processing, methane or other contaminant gases are removed via the purge gas conduit 683 attached to the conduit passage 646. The methane or other contaminant gas is removed by supplying a purge gas via the purge gas source 681. As purge gas is provided, methane produced around the heater rod 304 is passively removed via diffusion to the purge gas conduit 683 and subsequently swept away by the purge gas. Alternatively, the purge gas conduit 683 may be configured to supply a purge gas to the conduit passage 646 and to the passages 520, 522 disposed through the heater rod 304 before removing the purge gas via the conduit passage 646 or another purge gas removal passage (not shown). The porosity of the heater rod 304 enables the purge gas to be in communication with other portions of the heater rod 304 and the cavity 606 of the first heater 400A. Therefore, methane or other contaminants formed near the end of the heater rod 304 disposed in the first heater 400A may be removed. Removing the methane or other contaminants reduces the chance of substrates within the processing volume from being contaminated. In embodiments in which argon purge gas is utilized, methane creation and the erosion of the graphite within the heaters 400A, 400B and the heater rod 304 is eliminated, as the argon does not react with the graphite to form methane. Other inert gases may additionally be supplied by the purge gas source 681 to vent the heater rod 304 and the passages 520, 522. Other inert gases include helium and nitrogen.

A socket similar to the socket 303 of FIG. 6B is utilized with each of the heater rods 304. In some embodiments the socket 303 is described as a first socket and each of the sockets 305, 313, 315 are a second socket, a third socket, and a fourth socket respectively.

While the foregoing is directed to embodiments of the present disclosure, other and further embodiments of the disclosure may be devised without departing from the basic scope thereof, and the scope thereof is determined by the claims that follow.

What is claimed is:

1. A heating system for substrate processing comprising:
   a first heater comprising a continuous heating coil;
   a first heater rod coupled to a first connection point of the first heater;
   a second heater rod coupled to a second connection point of the first heater, wherein each of the first heater rod and the second heater rod are configured to be screwed onto the first heater and comprise a passage disposed therethrough;
   a socket coupled to one of the first heater rod or the second heater rod at a distal end opposite the first heater, the socket comprising:
   a feedthrough coupled to the first heater rod or the second heater rod and comprising a feedthrough inert gas passage fluidly coupled to the passage disposed through the first heater rod or the second heater rod; and
   a cooling plate disposed around at least a portion of the feedthrough.

2. The heating system of claim 1, wherein the socket is a first socket coupled to the first heater rod and a second socket is coupled to the second heater rod.

3. The heating system of claim 2, wherein the second socket comprises:
   a second feedthrough coupled to the second heater rod and comprising a second feedthrough inert gas passage fluidly coupled to a passage disposed through the second heater rod; and
   a second cooling plate disposed around at least a portion of the second feedthrough.

4. The heating system of claim 1, wherein the cooling plate further comprises:
   a cooling plate inert gas passage formed between a first surface adjacent the feedthrough and a second surface;
   a connection channel disposed in the first surface of the cooling plate and fluidly connecting the cooling plate inert gas passage and the feedthrough inert gas passage; and
   a cooling channel disposed through the cooling plate.

5. The heating system of claim 1, wherein the first heater rod further comprises:
   a first threaded section on a first distal end configured to engage the first heater;
   a second threaded section on a second distal end; and
   a fastening section disposed between a central shaft of the first heater rod and the first threaded section.

6. The heating system of claim 1, wherein the socket further comprises:
   a power line coupled to the feedthrough; and a purge gas source fluidly coupled to the feedthrough inert gas passage.

7. The heating system of claim 1, wherein the feedthrough is a nickel feedthrough.

8. The heating system of claim 1, wherein each of the first heater rod and the second heater rod are a carbon based material.

9. A socket assembly for coupling to a heater rod in a substrate processing chamber comprising:
a feedthrough comprising:
a cavity containing a female threaded section and configured to receive a heater rod; and
a feedthrough inert gas passage fluidly coupled to the cavity; and
a cooling plate disposed around at least a portion of the feedthrough and comprising:
a cooling plate inert gas passage;
a connection channel disposed in a surface of the cooling plate and fluidly connecting the cooling plate inert gas passage and the feedthrough inert gas passage; and
a cooling channel disposed through the cooling plate.

10. The socket assembly of claim 9, wherein the feedthrough comprises a metal or a metal alloy.

11. The socket assembly of claim 10, wherein the feedthrough comprises a nickel material.

12. The socket assembly of claim 9, further comprising:
a power line coupled to the feedthrough; and
a purge gas source fluidly coupled to the feedthrough inert gas passage.

13. The socket assembly of claim 12, wherein the power line is coupled to the feedthrough by a cap disposed around a protrusion on the feedthrough.

14. The socket assembly of claim 9, further comprising a feedthrough insulator disposed adjacent a surface of the feedthrough.

15. The socket assembly of claim 14, wherein the feedthrough insulator comprises a quartz, a glass, or a ceramic material.

16. The socket assembly of claim 14, wherein the feedthrough insulator comprises a heater rod sealing ring disposed on an inside surface of the feedthrough insulator.

17. The socket assembly of claim 9, wherein a first sealing ring and a second sealing ring are disposed on opposite sides of the connection channel and form a seal between the feedthrough and the cooling plate.

18. A heating system for substrate processing comprising:
a first heater comprising a continuous heating coil;
a first heater rod coupled to a first connection point of the first heater;
a second heater rod coupled to a second connection point of the first heater, wherein each of the first heater rod and the second heater rod comprise a passage disposed therethrough;
a socket coupled to one of the first heater rod or the second heater rod, the socket comprising:
a feedthrough coupled to the first heater rod or the second heater rod and comprising a feedthrough inert gas passage fluidly coupled to the passage disposed through the first heater rod or the second heater rod; and
a cooling plate disposed around at least a portion of the feedthrough, the cooling plate comprising a cooling plate inert gas passage fluidly coupled to the feedthrough inert gas passage and a cooling channel disposed through the cooling plate.

19. The heating system of claim 18, wherein the first heater and at least a portion of the first heater rod and the second heater rod include a coating disposed thereon.

20. The heating system of claim 19, wherein the coating comprises a silicon carbide (SiC) coating or a Pyrolytic Boron Nitride (pBN) coating.

* * * * *